United States Patent [19]

Pepper et al.

[11] Patent Number: 4,803,696

[45] Date of Patent: Feb. 7, 1989

[54] LASER WITH GRATING FEEDBACK UNSTABLE RESONATOR

[75] Inventors: David M. Pepper, Malibu; Richard R. Craig, Los Angeles, both of Calif.

[73] Assignee: Hughes Aircraft Company, Los Angeles, Calif.

[21] Appl. No.: 67,893

[22] Filed: Jun. 30, 1987

[51] Int. Cl.$^4$ .............................................. H01S 3/08
[52] U.S. Cl. ........................................ 372/95; 372/92; 372/96; 372/98; 372/99; 372/102
[58] Field of Search ....................... 372/95, 96, 92, 98, 372/99, 102, 45, 53

[56] References Cited

U.S. PATENT DOCUMENTS

| | | | |
|---|---|---|---|
| 3,675,157 | 7/1972 | Kaminow et al. | 372/96 |
| 3,868,589 | 2/1975 | Wang | 372/96 |
| 4,464,762 | 8/1984 | Furuya | 372/50 |
| 4,646,314 | 2/1987 | Opower | 372/99 |

OTHER PUBLICATIONS

Tsang et al., "Strip Buried Heterostructure Laser with Passive Distributed Bragg Reflector", IEEE Journal of Quantum Electronics, vol. Q.E.-15, No. 10, Oct. 1979, pp. 1091-1093.
Bogatov et al, "Injection Laser with an Unstable Resonator", Sov. J. Quantum Electron 10(5), May 1980, pp. 620-622.
R. R. Craig et al, "Etched-Mirror Unstable-Resonator Semiconductor Lasers", Electronics Letters, vol. 21, No. 2, Jan. 17, 1985, pp. 62-63.
A. E. Siegman, "Unstable Optical Resonators for Laser Applications", Proceeding of the IEEE, vol. 53, Mar. 1965, pp. 277-287.
J. McIerney et al, "Electron-beam lithography for formation of submicrometer gratings in semiconductor integrated optoelectronics", Proceedings of Topical Meeting on Integrated and Guided-Wave Optics, Feb. 1986, Atlanta, Georgia.
Willie W. Ng et al, "Holographic Interference Lithography for Integrated Optics," IEEE Transactions on Electron Devices, vol. ED-25, No. 10, Oct. 1978, pp. 1193-1200.
J. Puretz et al, "Focused-Ion-Beam Micromachined AlGaAs Semiconductor Laser Mirrors", Electronics Letters, vol. 22, No. 13, Jun. 19, 1986, pp. 700-701.
L. R. Harriott et al, "Micromachining of Integrated Optical Structures", Applied Physics Letters, 48 (25), Jun. 23, 1986, pp. 1704-1706.
S. Wang, "Principles of Distributed Feedback and Distributed Bragg-Reflector Laser", IEEE J. of Quantum Electronics, vol. QE-10, No. 4, 1974, pp. 41314 427.
H. Kawanishi et al, "Temperature Characteristics of a GaAs-AlGaAs Integrated Twin-Guide Laser with Distributed Bragg Reflectors", Japanese Journal of Applied Physics, vol. 17, No. 9, Sep. 1978, pp. 1599-1603.
S. Sakakibara et al, "Single-Mode Oscillation Under High-Speed Direct Modulation in GainAsP/InP Integrated Twin-Guide Laser with Distributed Bragg Reflectors", Electronics Letters, Jun. 5, 1980, vol. 16, No. 12, pp. 456-458.
K. Utaka et al, "1.5-1.6 μm Gain ASP/InP Integrated Twin-Guide Lasers with First-Order Distributed Bragg Reflectors", Electronics Letters, vol. 16, No. 12, Jun. 5, 1980, pp. 455 and 456.

Primary Examiner—William L. Sikes
Assistant Examiner—Georgia Y. Epps
Attorney, Agent, or Firm—V. D. Duraiswamy; A. W. Karambelas

[57] ABSTRACT

A laser is disclosed which uses a curved spatial grating in either its reflective or output regions, or both, or distributed throughout the laser resonator, to produce an unstable optical reflection pattern which fills the resonating cavity more efficiently than in prior devices. Various combinations of different grating curvatures are disclosed. The invention is particularly adapted to semiconductor lasers.

16 Claims, 2 Drawing Sheets

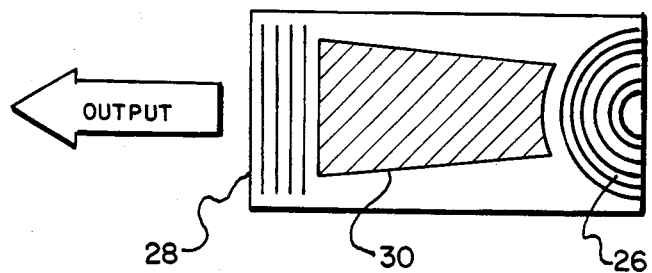
Fig.4.
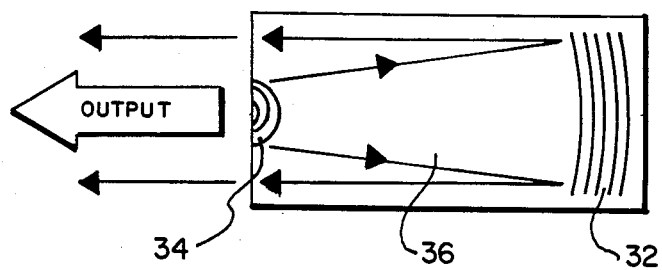
Fig.5.
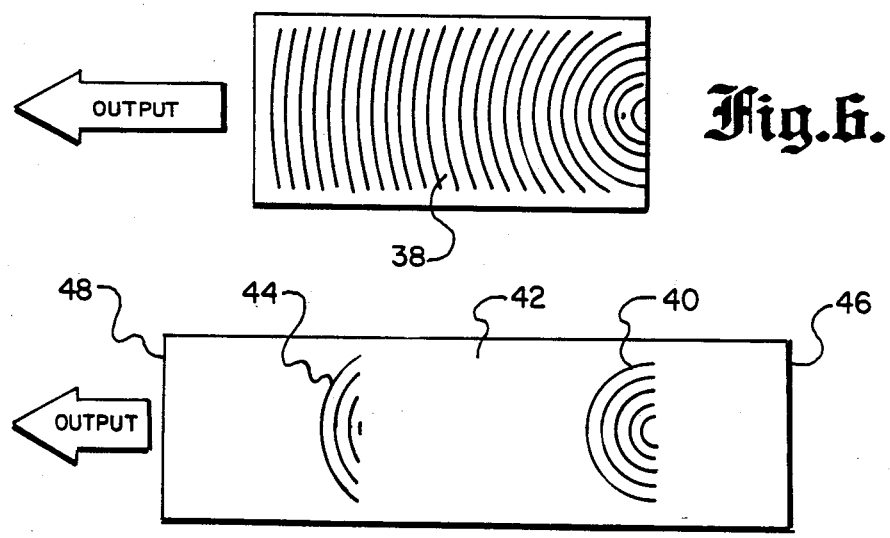
Fig.6.
Fig.7.

LASER WITH GRATING FEEDBACK UNSTABLE RESONATOR

BACKGROUND OF THE INVENTION

1. Field of the Invention

This invention relates to lasers, and more particularly to semiconductor lasers which employ optical gratings.

2. Description of the Related Art

Semiconductor lasers are known which produce lasing action within the confines of a semiconductor chip. No external mirrors are necessary in general, since the high reflectivity from the refractive index differential at the semiconductor-air interface is normally sufficient. Since the chips are cleaved along natural crystalline planes, the parallelism of the reflective surfaces is assured, and further polishing of the optical surfaces may be unnecessary. A typical semiconductor laser is illustrated in very simplified form in FIG. 1. It consists of a thin layer of semiconductor material 2, generally about 1 micron deep and about 200 microns long. The device may be formed from semiconductors such as GaAs or InP. A gain medium 4 is defined by current injection to an internal pn junction formed by dopants, or by optical stimulation. In response to threshold stimulation, a laser beam 6 is emitted from the output side of the device. A general reference on semiconductor lasers which may be designed to operate in either pulsed or continuous wave modes, is provided by H. C. Casey and M. B. Parish, "Heterostructure Lasers", Academic Press, 1978.

One form of semiconductor laser, illustrated in FIG. 2, uses an optical spatial grating in the form of a distributed Bragg reflector 8 as the reflecting element at one end of the laser. The partial reflector at the output end of the laser is provided either by the semiconductor/air interface, or by another distributed Bragg reflector 10. Alternately, a distributed feedback grating may be used which spans the entire lasing cavity, thereby providing a more stable configuration. The application of distributed Bragg reflector and distributed feedback gratings to semiconductor lasers is discussed in the Casey and Parish reference mentioned above, and in U.S. Pat. No. 4,464,762 to Furuya. The periodicity of the gratings is selected to fix the output laser beam at a desired wavelength. For example, for GaAs having a wavelength of 860 nm, the periodicity would be spaced approximately 130 nm for first order operation.

A principal limitation of the semiconductor lasers discussed thus far, whether or not they employ optical gratings, is that they generally operate in a "stable resonator" mode. This means that the active resonation tends to be concentrated towards the center of the device, rather than spreading out uniformly through the resonation cavity. This phenomenon, known as filamence, is associated with instabilities in the laser media. Also, these devices must often lase in multiple longitudinal (or spectral) modes. If more power is desired, the device can be made larger, but this increases the multimode operation problem. The beams are also subject to undesirable nonlinear effects such as self-focusing, beam breakup, beam fanning and filamentation which can cause an incoherent beam. Furthermore, when reflection takes place at or very near the surface facets of the chip, a high energy density may structurally damage areas on the end facets. This can result in a significant degradation of the beam if the structural damage is substantial.

An "unstable resonator" laser has been proposed in which the resonation uniformly fills the lasing cavity, optical energy in the laser. In this approach, one or both of the end facets of the laser chip are physically worked into a curve, as opposed to the normal plane facet structure. As originally proposed, the curvature was formed by a physical grinding process, discussed in Bogatov et al., Soviet Journal of Quantum Electronics, Vol. 10, pp. 620-622, May 1980. The curvature is designed so that, upon repeated reflection from each end of the laser, the light spreads out and fills the gain medium, rather than being concentrated down the middle. A more refined manufacturing process, in which the desired curvature is etched by photolithography techniques, is discussed by Richard R. Craig, one of the present inventors, Craig et al., Electronics Letters, Vol. 21, No. 2, January 1985. Unstable optical resonators are also discussed in A. E. Siegman, Proceedings of the IEEE, Vol. 53, pp. 277-287, March 1965.

While the unstable resonator approach makes more efficient use of the lasing medium and is capable of extracting a greater energy level from the same laser device, it also has some significant drawbacks. The process of either grinding or etching the end facets of the laser to the desired curvatures is difficult to precisely control; crystalline structures naturally tend to cleave along straight lines. The grinding or etching process can damage the surfaces of the end facets, and can also introduce impurity absorption. Also, these devices can be subject to mode-hopping and chirping problems common to any diode laser that is not spectrally selective and cannot prevent transverse oscillations. This is a problem in large gain regions which might oscillate off of stray reflections not along the optic axis. Accordingly, while the available unstable resonator techniques provide at least a potential improvement in beam quality and efficiency, they introduce several disadvantages which are not found with other semiconductor lasers.

SUMMARY OF THE INVENTION

In view of the above problems, the purpose of the present invention is to provide a novel and improved semiconductor laser, and also other types of lasers, which achieve the advantages of the unstable resonator, and yet avoid the frequency instability and processing limitations of such devices.

In accordance with the invention, a semiconductor laser having a partially reflective output region, an opposed reflective region, and a gain medium between the two is provided. Either the reflective region or the output region, or both, have an optical spatial grating with a curvature that forms an unstable resonator in response to lasing stimulation. The grating can be provided in the reflective region in the form of a distributed Bragg reflector which is curved convex with respect to the gain medium; the output region may also optionally have a second distributed Bragg reflector grating, either curved or uncurved. In another embodiment, the grating in the reflective region is a distributed Bragg reflector curved concave with respect to the gain medium, and the output region has another distributed Bragg reflector grating curved convex with respect to the gain medium. Instead of a distributed Bragg reflector, the curved grating may be provided as a distributed feedback grating which extends through the output region, reflective region and gain medium, and is curved convex with respect to the laser output. When the grating is buried within the semiconductor member, rather than located adjacent a surface facet, the danger of damaging the facet region from excessive beam energy levels is reduced. The invention is also applicable to other types of lasers capable of supporting optical spatial gratings, such as planar structure lasers and planar dye lasers.

Other features and advantages of the invention will be apparent to those skilled in the art from the following detailed description of preferred embodiments, taken together with the accompanying drawings, in which:

DESCRIPTION OF THE DRAWINGS

FIGS. 3-7 are diagrams illustrating various combinations and orientations of curved gratings which may be used in accordance with the invention to enhance semiconductor laser performance.

DETAILED DESCRIPTION OF PREFERRED EMBODIMENTS

Figure 1:
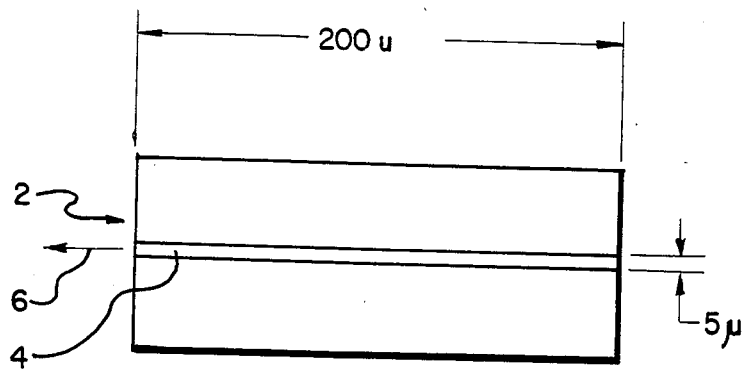
FIG. 1 is a simplified plan view of a conventional semiconductor laser, discussed above.
Figure 2:
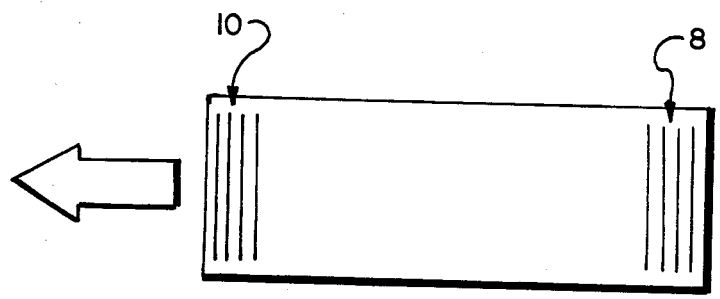
FIG. 2 is a diagram of a prior semiconductor laser which uses flat, planar optical spatial gratings as reflective elements.
Figure 3:
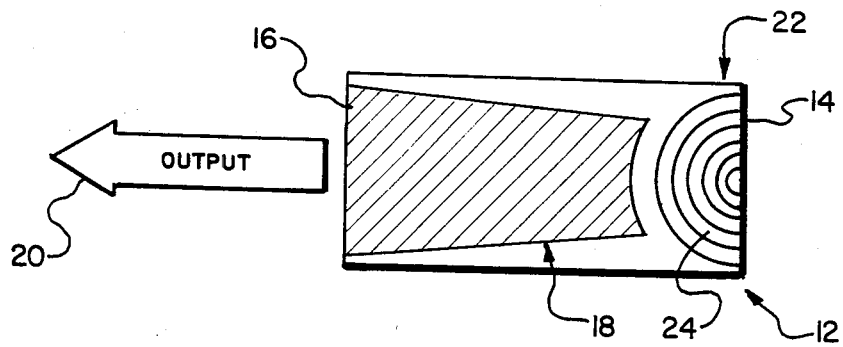

The essence of the present invention is the use of one or more curved optical spatial gratings in a semiconductor laser, or other laser capable of accepting such gratings, to obtain the advantages of an unstable resonator without the disadvantages which accompany prior unstable resonators. In FIG. 3 a semiconductor laser 12 is illustrated which has a reflecting end facet 14, an output end facet 16, and an internal lasing medium 18. The lasing medium can be formed either by external optical or electronic stimulation, or by injecting current across a doped junction. Lasing action is achieved by stimulating the gain medium to build up an oscillation, which is emitted as an output laser beam 20 upon reaching a threshold level.

A reflective region 22 is formed adjacent end facet 14 to reflect light back into the gain medium. The reflective region comprises an optical spatial grating in the form of a distributed Bragg reflector 24, which is curved convex with respect to the gain medium 18. In operation, light is reflected back and forth between curved grating 24 and the output semiconductor/air interface at end facet 16, with some of the light being output through facet 16 as beam 20, and the remainder reflected back through the gain medium to sustain the lasing action. Light which strikes curved gratings 24 is reflected back at an angle of reflection equal to the angle of incidence. Since the gratings are curved, the reflected light (except for light along the exact laser axis) will fill the lasing cavity and not concentrate at its center. This results in a desired unstable resonator action.

Another embodiment is illustrated in FIG. 4. A distributed Bragg reflector grating 26 is provided in the reflecting region of the semiconductor laser, as in the previous embodiment. A partially reflective output coupler 28 is provided on the other side of gain medium 30 in the form of another distributed Bragg reflector grating adjacent the output facet surface. Output coupler grating 28 may be either planar as shown in FIG. 4, or curved (not shown), depending upon the desired spreading of the beam within the cavity.

In FIG. 5 the reflector grating 32 is again a distributed Bragg reflector, but unlike the previous embodiments it is curved concave with respect to the gain medium. An output coupler grating in the form of curved distributed Bragg reflector 34 is formed on the output side of the gain medium 36. Output grating 34 is curved convex with respect to the gain medium, and has a greater degree of curvature than does reflector grating 32. The reflector grating 32 tends to produce a high degree of collimation, as indicated by the ray traces in the figure, while output grating 34 spreads the beam so that it substantially fills the cavity.

In FIG. 6 a distributed feedback grating 38 covers the entire laser cavity, including the output region, reflective region and gain medium. It is curved convex with respect to the laser output so as to again fill the laser cavity with the oscillating beam.

FIG. 7 illustrates an embodiment in which a pair of distributed Bragg reflector gratings are used, one grating 40 in the reflective region being curved convex with respect to the gain medium 42, and an output distributed Bragg reflector grating 44 in the output region curved concave with respect to the gain medium. The curvature of reflector grating 40 is greater than that of output grating 44, thereby causing the oscillating beam to fill the cavity between the two gratings. Gratings 40 and 44 are buried within the semiconductor chip, at a distance from their respective end facets 46 and 48. Buried gratings can be fabricated with available technology, and do not damage the surface of the chip. By locating the gratings away from the end facets, the beam will tend to diffuse by the time it has passed through a grating and reached its corresponding facet. This results in a lower energy density at the chip surface, thereby reducing the danger of damaging the chip with high laser energy levels.

Various techniques are available for forming the gratings. The use of electron beams for this purpose is discussed in J. McInerney et al., Proceeding of Topical meeting on Integrated and Guided-Wave Optics, February 1986, Atlanta, Ga. Holographic techniques may also be used to form the gratings; see W. Ng et al., IEEE Transactions on Electron Devices, Vol. Ed.-25, No. 10, October 1978. Focused ion beams provide another potential way to form high precision gratings. Discussions of focused ion beams are provided in J. Puretz et al., "Focused Ion Beam Micromachined AlGaAs Semiconductor Laser Mirrors", Electronics Letters, Vol. 22, 19 June 1986, pages 700-701 and L. R. Harriott et al., "Micromachining of Integrated Optical Structures", Applied Physics Letters, Vol. 48, 23 June 1986, pages 1704-1706.

The degree of grating curvature should match the beam wavefront in many cases, so that the beam uniformly fills the cavity. The beam wavefront is determined by the geometry and material of the laser chip. The grating periodicity is selected to establish the desired wavelength for the beam. The grating spacing d should be $$d = N\lambda/2$$

where $\lambda$ is the desired lasing wavelength in the material, and N is the order in which the grating operates. The frequency selectivity of the grating will force the laser to operate in a single longitudinal mode without mode-hopping effects. The coherently scattered wave from the curved grating will have a cylindrical wavefront which appears to come from a position at the center of the curved grating. Since the grating essentially forms the reflective element, the end facets can be simply cleaved, resulting in an improved spatial mode. Also, with gratings on either side of the gain medium, the intense intracavity circulating fields are prevented from interacting with the end facets.

The disclosed semiconductor lasers avoid the need to grind or etch the end facets of the laser to achieve unstable resonation, minimizes frequency instability such as chirping and mode-hopping, and helps to maintain the spatial uniformity of the light. A superior output beam quality is achieved when compared to prior unstable resonators, since the end facets can be simply cleaved as opposed to etching or grinding, and the resonator can be designed to optimally extract the stored optical energy in the laser. With an appropriate design, the laser output can be Bragg-scattered perpendicular to the device surface, thereby reducing beam divergence. Transverse oscillations within the laser are inhibited, as are non-linear effects such as self-focusing, beam breakup and beam fanning.

While particular embodiments of the invention have been shown and described, numerous variations and alternate embodiments will occur to those skilled in the art. For example, the principles of the invention might also be applied to planar structure lasers, such as rare earth doped glasses like Nd:glass, and to planar dye lasers wherein the active medium consists of an organic dye dissolved in a solvent or solid host material. Also, the invention can be applied to both continuous wave and pulsed lasers. Accordingly, it is intended that the invention be limited only in terms of the appended claims.

We claim:

1. An unstable resonator laser, comprising:
   a gain medium,
   a partially reflective output coupler positioned on one side of the gain medium to partially reflect back into the gain medium and partially transmit optical radiation received from the gain medium, and
   a reflector positioned on the other side of the gain medium to reflect optical radiation received from the gain medium back into the gain medium,
   at least one of said output coupler and said reflector comprising a material capable of supporting an optical spatial grating, and having an optical spatial grating therein which is curved to produce unstable resonation through the gain medium in response to lasing stimulation.

2. The unstable resonator laser of claim 1, the reflector including an optical spatial grating in the form of a distributed Bragg reflector which is curved convex with respect to the gain medium.

3. The unstable resonator laser of claim 2, the output coupler including an optical spatial grating in the form of a distributed Bragg reflector.

4. The unstable resonator laser of claim 3, the reflector including an optical spatial grating in the form of a distributed Bragg reflector which is curved concave with respect to the gain medium, and the output coupler including a material capable of supporting an optical spatial grating, and having an optical spatial grating in the form of a distributed Bragg reflector which is curved convex with respect to the gain medium.

5. The unstable resonator laser of claim 1, the grating comprising a distributed feedback grating which extends through the output coupler reflector and gain mediums, and is curved convex with respect to the output region.

6. The unstable resonator laser of claim 1, wherein the grating is buried within its supporting material.

7. The unstable resonator laser of claim comprising a semiconductor laser.

8. The unstable resonator laser of claim 1, comprising a planar structure laser.

9. The unstable resonator laser of claim comprising a planar dye laser.

10. In a semiconductor laser, an improved laser structure comprising:
    a semiconductor member having a partially reflective output region, an opposed reflective region, and a gain medium between said output and reflective regions,
    at least one of said reflective region and said output region comprising an optical spatial grating formed in the semiconductor member and having a curvature which produces unstable resonation within the member in response to lasing stimulation.

11. The semiconductor laser of claim 10, wherein the reflective region comprises an optical spatial grating in the form of a distributed Bragg reflector which is curved convex with respect to the gain medium.

12. The semiconductor laser of claim 11, wherein the output region comprises an optical spatial grating in the form of a distributed Bragg reflector.

13. The semiconductor laser of claim 10, the reflective region comprising an optical grating in the form of a distributed Bragg reflector which is curved concave with respect to the gain medium, and the output region comprising an optical spatial grating in the form of a distributed Bragg reflector which is curved convex with respect to the gain medium.

14. The semiconductor laser of claim 10, the grating comprising a distributed feedback grating which extends through the output region, reflective region and gain medium, and is curved convex with respect to the output region.

15. The semiconductor laser of claim 10, wherein the grating is buried within the semiconductor member.

16. The unstable resonator of claim 1, wherein said gain medium, output coupler and reflector are formed in a monolithic structure.

* * * * *